United States Patent
Liu et al.

(10) Patent No.: US 12,550,484 B2
(45) Date of Patent: Feb. 10, 2026

(54) LED STRUCTURE WITH STRESS RELEASING LAYERS COMPRISING PERIODIC STRUCTURES

(71) Applicant: Enkris Semiconductor (Wuxi), Ltd., Wuxi (CN)

(72) Inventors: Weihua Liu, Wuxi (CN); Xiaobo Sun, Wuxi (CN); Kai Cheng, Wuxi (CN)

(73) Assignee: Enkris Semiconductor (Wuxi), Ltd., Wuxi (CN)

( * ) Notice: Subject to any disclaimer, the term of this patent is extended or adjusted under 35 U.S.C. 154(b) by 383 days.

(21) Appl. No.: 18/304,292

(22) Filed: Apr. 20, 2023

(65) Prior Publication Data

US 2024/0355962 A1 Oct. 24, 2024

(51) Int. Cl.
| | |
|---|---|
| *H10H 20/815* | (2025.01) |
| *H10H 20/01* | (2025.01) |
| *H10H 20/812* | (2025.01) |
| *H10H 20/825* | (2025.01) |
| *H10H 20/83* | (2025.01) |

(52) U.S. Cl.
CPC .... *H10H 20/815* (2025.01); *H10H 20/01335* (2025.01); *H10H 20/812* (2025.01); *H10H 20/825* (2025.01); *H10H 20/83* (2025.01); *H10H 20/032* (2025.01)

(58) Field of Classification Search
CPC ........... H10H 20/815; H10H 20/01335; H10H 20/812; H10H 20/825; H10H 20/83; H10H 20/032
See application file for complete search history.

(56) References Cited

U.S. PATENT DOCUMENTS

| | | | | |
|---|---|---|---|---|
| 2015/0311380 A1* | 10/2015 | Solari | ................ | H01L 21/0262 438/46 |
| 2015/0311382 A1* | 10/2015 | Kim | ................... | H10H 20/8215 257/94 |

FOREIGN PATENT DOCUMENTS

| | | |
|---|---|---|
| CN | 101388337 A | 3/2009 |
| CN | 102664188 A | 9/2012 |
| CN | 102664188 B | 7/2014 |
| CN | 104143595 B | 6/2018 |
| CN | 112635626 A | 4/2021 |
| CN | 213752740 U | 7/2021 |
| CN | 108807507 B | 9/2021 |

* cited by examiner

*Primary Examiner* — Herve-Louis Y Assouman
(74) *Attorney, Agent, or Firm* — BSJ & SUN LLC

(57) ABSTRACT

The present disclosure provides a semiconductor structure and a manufacturing method thereof. The semiconductor structure includes: a substrate; and a first semiconductor layer, a first stress releasing layer, an active layer and a second semiconductor layer that are sequentially stacked on the substrate from bottom to top; where conductive types of the first semiconductor layer and the second semiconductor layer are opposite, the first stress releasing layer comprises one or more periodic structures, each of the one or more periodic structures comprises a first group III nitride and a second group III nitride, and an In component content in the first group III nitride is different from an In component content in the second group III nitride. By the semiconductor structure provided in the present disclosure, an active layer with high In component content can be epitaxial grown while ensuring high crystal quality.

18 Claims, 10 Drawing Sheets

LED STRUCTURE WITH STRESS RELEASING LAYERS COMPRISING PERIODIC STRUCTURES

TECHNICAL FIELD

The present disclosure relates to the field of semiconductor technology, in particular to semiconductor structures and manufacturing methods thereof.

BACKGROUND

Group-III nitride semiconductor structures represented by GaN have attracted increasing attention. For example, in a LED (light-emitting diode) structure containing a GaN-based material, due to large lattice mismatches between a GaN-based material and an InGaN material with a high In (indium element) component content, when growing an InGaN active layer with a high In component content (for example, the In component proportion in the active layer exceeds 40%) on a GaN-based material, on the one hand, the InGaN material with a high In component content is more difficult to grow on the GaN-based material, and on the other hand, an active layer with high In component content has strong built-in stress, resulting in an increase in the material defect density of the active layer, a decrease in material quality, which seriously affects the internal quantum efficiency of the LED structure.

SUMMARY

In view of this, according to a first aspect of the present disclosure, a semiconductor structure is provided, including: a substrate; and a first semiconductor layer, a first stress releasing layer, an active layer and a second semiconductor layer that are sequentially stacked on the substrate from bottom to top; where conductive types of the first semiconductor layer and the second semiconductor layer are opposite, the first stress releasing layer includes one or more periodic structures, each of the one or more periodic structures includes a first group III nitride and a second group III nitride, and an In component content in the first group III nitride is different from an In component content in the second group III nitride.

In some embodiments, an average In component content in the first stress releasing layer is less than or equal to an In component content in the active layer.

In some embodiments, the first stress releasing layer includes multiple periodic structures along a direction from the substrate to the active layer, where the average In component content in first group III nitrides in the multiple periodic structures and/or an average In component content in second group III nitrides in the multiple periodic structures remains unchanged; or the average In component content in first group III nitrides in the multiple periodic structures and/or the average In component content in second group III nitrides in the multiple periodic structures gradually increases.

In some embodiments, along the direction from the substrate to the active layer, in each periodic structure of the multiple periodic structures, the In component content in the first group III nitride and/or the In component content in the second group III nitride gradually increases.

In some embodiments, the first group III nitride includes $Al_xIn_yN$, where x represents an Al component content, y represents an In component content, $x+y=1$, $0.65 \leq x \leq 0.9$, and $0.1 \leq y \leq 0.35$.

In some embodiments, the first group III nitride includes $Al_xIn_yGa_zN$, where x represents an Al component content, y represents an In component content, z represents a Ga component content, $x+y+z=1$, $0.65*(1-z) \leq x \leq 0.9*(1-z)$, $0.1*(1-z) \leq y \leq 0.35*(1-z)$, and $0 \leq z \leq 0.5$.

In some embodiments, a thickness of the one or more periodic structures is between 10 nm and 500 nm.

In some embodiments, the first group III nitride or the second group III nitride includes at least one of AlInN, InAlGaN, GaN, AlGaN, InGaN, AlN or InN.

In some embodiments, the semiconductor structure further includes a second stress releasing layer between the substrate and the first semiconductor layer, where an average In component content in the second stress releasing layer is less than or equal to the average In component content in the first stress releasing layer.

In some embodiments, the semiconductor structure further includes a buffer layer between the substrate and the second stress releasing layer.

In some embodiments, the semiconductor structure further includes a mask layer on a side of the buffer layer far from the substrate, where the mask layer includes one or more grooves that expose the buffer layer, and the second stress releasing layer fills the one or more grooves and covers a surface of the mask layer.

In some embodiments, a shape of the one or more grooves includes at least one of polygonal, elongated, elliptical or circular.

In some embodiments, the semiconductor structure further includes a protection layer between the second stress releasing layer and the first semiconductor layer, and/or a protection layer between the first stress releasing layer and the active layer, where a material of the protection layer includes AlN or AlGaN.

In some embodiments, the semiconductor structure further includes a first electrode electrically connected to the first semiconductor layer; and a second electrode electrically connected to the second semiconductor layer.

According to a second aspect of the present disclosure, a manufacturing method of a semiconductor structure, including: providing a substrate; forming a first semiconductor layer on the substrate; forming a first stress releasing layer including one or more periodic structures on a side of the first semiconductor layer far from the substrate, where each of the one or more periodic structures includes a first group III nitride and a second group III nitride, and an In component content in the first group III nitride is different from an In component content in the second group III nitride; forming an active layer on a side of the first stress releasing layer far from the substrate; and forming a second semiconductor layer on a side of the active layer far from the substrate, where conductive types of the first semiconductor layer and the second semiconductor layer are opposite.

In some embodiments, before forming the first semiconductor layer, the method further includes: forming a buffer layer on the substrate; forming a second stress releasing layer on a side of the buffer layer far from the substrate layer, where an average In component content of the second stress releasing layer is less than or equal to an average In component content of the first stress releasing layer; and forming the first semiconductor layer on a side of the second stress releasing layer far from the substrate.

In some embodiments, before forming the second stress releasing layer, the method further includes: forming a mask layer on a side of the buffer layer far from the substrate layer; patterning the mask layer to form one or more grooves on the mask layer that expose the buffer layer; and laterally epitaxially growing the second stress releasing layer in the one or more grooves and epitaxially growing the second stress releasing layer to cover a surface of the mask layer.

In some embodiments, before forming the first semiconductor layer, the method further includes: forming a protection layer on a side of the second stress releasing layer far from the substrate; and/or before forming the active layer, the method further includes: forming a protection layer on a side of the first stress releasing layer far from the substrate.

In some embodiments, the method further includes: etching the second semiconductor layer, the active layer and the first stress releasing layer, to expose a portion of the first semiconductor layer; forming a first electrode on the exposed part of the first semiconductor layer; and forming a second electrode on the second semiconductor layer.

Figure 1:
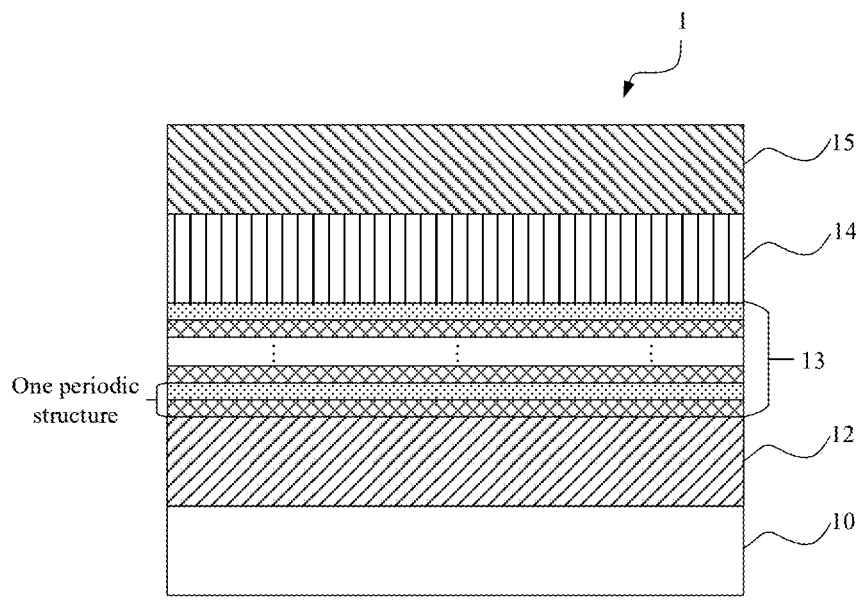
FIG. 1 is a schematic diagram of a semiconductor structure 1 according to an embodiment of the present disclosure.

Description of references: substrate 10; buffer layer 11; first semiconductor layer 12; first stress releasing layer 13; active layer 14; second semiconductor layer 15; second stress releasing layer 16; mask layer 17; protection layer 18; groove 20; first electrode 21; second electrode 22; semiconductor structures 1,2,3,4.

DETAILED DESCRIPTION

Exemplary embodiments will be described in detail herein, examples of which are illustrated in the accompanying drawings. Where the following description refers to the drawings, the same numerals in different drawings refer to the same or similar elements unless otherwise indicated. Embodiments described in the illustrative examples below are not intended to represent all embodiments consistent with the present disclosure. Rather, they are merely embodiments of devices consistent with some aspects of the present disclosure as recited in the appended claims.

The purpose of the present disclosure is to provide semiconductor structures and manufacturing methods thereof to release a built-in stress in an active layer, such that a high-quality active layer with a high In component can be epitaxially grown.

FIG. 1 is a schematic diagram of a semiconductor structure 1 according to an embodiment of the present disclosure. Referring to FIG. 1, the semiconductor structure 1 includes: a substrate 10; and a first semiconductor layer 12, a first stress releasing layer 13, an active layer 14 and a second semiconductor layer 15 that are sequentially stacked from bottom to top on the substrate 10; where a conductive type of the first semiconductor layer 12 is different from a conductive type of the second semiconductor layer 15, the first stress releasing layer 13 includes one or more periodic structures, each of the one or more periodic structures includes a first group III nitride and a second group III nitride, and a content of an In component in the first group III nitride is different from a content of an In component in the second group III nitride.

In the semiconductor structure provided in the embodiment, by providing the first stress releasing layer 13 including one or more periodic structures containing In elements between the first semiconductor layer 12 and the active layer 14, the built-in stress in the active layer 14 formed on the first semiconductor layer 12 can be released, thereby enabling the epitaxial growth of the active layer 14 with a high In component content while ensuring high crystal quality. Each periodic structure in the first stress releasing layer 13 includes a first group III nitride and a second group III nitride, where a content of In component in the first group III nitride is different from a content of In component in the second group III nitride. The periodic structure formed by alternately stacking the first group III nitride and the second group III nitride with different In component contents can effectively avoid the precipitation of In element in the first stress releasing layer 13 and improve the stability of the In component in the first stress releasing layer 13, ensuring that the stress of the active layer 14 with high In component can be released, thereby avoiding the precipitation of In element in the active layer 14 and increasing the In component content in the active layer 14.

A material of the substrate 10 can include a conventional substrate material such as Si, SOI (Silicon On Insulator), $Al_2O_3$, silicon carbide, or GaN, which is not limited in embodiments of the present disclosure.

The first semiconductor layer 12 may include a GaN-based material with N-type ions doped, and the second semiconductor layer 15 may include a GaN-based material with P-type ions doped. Alternatively, the first semiconductor layer 12 may include a GaN-based material with P-type ions doped, and the second semiconductor layer 15 may include a GaN-based material with N-type ions doped, which is not limited in embodiments of the present disclosure.

The active layer 12 is a GaN-based material with a high In component content, such as InGaN. In an embodiment of the present disclosure, the In component proportion in the active layer 12 exceeds 40%. The active layer 12 can include at least one of a single quantum well structure, a multiple quantum well (MQW) structure, a quantum line structure or a quantum dot structure. The average In component content in the first stress releasing layer 13 is less than or equal to the In component content in the active layer 14, to enable the first stress releasing layer 13 to effectively transition to the active layer 14 to ensure the crystal quality of the active layer 14 with high In component content.

The first stress releasing layer 13 includes one or more periodic structures, each of the one or more periodic structures includes at least one layer of the first group III nitride and at least one layer of the second group III nitride, and a content of In component in the first group III nitride is different from a content of In component in the second group III nitride.

The formation process of each layer of the first group III nitride and the second group III nitride in each periodic structure may include: atomic layer deposition (ALD), chemical vapor deposition (CVD), molecular beam epitaxy (MBE), plasma enhanced chemical vapor deposition (PECVD), low pressure chemical vapor deposition (LPCVD), metal-organic chemical vapor deposition (MOCVD), or a combination thereof.

Regarding the proportion of the In component in periodic structures, in some embodiments, along a direction from the substrate 10 to the active layer 14, the average In component content in the first group III nitrides or second group III nitrides in multiple periodic structures remain unchanged. Referring to the dot line in FIG. 2, in a direction from the substrate 10 to the active layer 14, the content of In component in first group III nitrides in multiple periodic structures remains unchanged, and second group III nitrides do not contain In elements. In other embodiments, first group III nitrides in multiple periodic structures do not contain In elements, and the content of In component in the second group III nitrides remain unchanged. In further embodiments, both the first group III nitrides and second group III nitrides contain In components, the In component content in the first group III nitrides remain unchanged in the direction from the substrate 10 to the active layer 14, and the In component content in the second group III nitrides remain unchanged in the direction from the substrate 10 to the active layer 14, and the first III nitride and second group III nitride are different. The average In component content in each periodic structure is, for example, 20%, 30%, or 35%, which is not limited in the present disclosure.

In some embodiments, in a case that in each of multiple periodic structures, the average In component content in the first group III nitrides or second group III nitrides remain unchanged, the In component content in each layer can further gradually increases. In the direction from the substrate 10 to the active layer 14, the average In component content in the first group III nitrides and/or second group III nitrides in multiple periodic structures gradually increases. Referring to the dash line in FIG. 2, in the direction from the substrate 10 to the active layer 14, it is assumed that there are n periodic structures, and the content of In component in the first group III nitrides in periodic structures increases in a stepwise manner, where the second group III nitrides in periodic structures do not contain In component. For example, the content of In component in the first group III nitride in a first periodic structure is about 10%, the content of In component in the first group III nitride in a second periodic structure is about 15%, . . . , and the content of In component in the first group III nitride in a n-th periodic structure is about 35%. In other embodiments, in the direction from the substrate 10 to the active layer 14, the first group III nitride in each periodic structure does not contain an In component, and the content of the In component in the second group III nitrides in the periodic structures increases in a stepwise manner. For example, the content of In component in the second group III nitride in a first periodic structure is about 10%, the content of In component in the second group III nitride in a second periodic structure is about 15%, . . . , and the content of In component in the second group III nitride in a n-th periodic structure is about 35%. In further embodiments, along a direction from the substrate 10 to the active layer 14, the content of In component in the first group III nitrides in the periodic structures gradually increases in a stepwise manner, and the content of In component in the second group III nitrides in the periodic structures gradually increases in a stepwise manner, and the first group III nitride and the second group III nitride is different. For example, the content of the In component in the first group III nitrides in the periodic structures increases from 10% to 35% in a stepwise manner, and the content of the In component in the second group III nitrides in the periodic structures increases from 18% to 38% in a stepwise manner, which is not limited in the present disclosure. As a result, the average In component content in the periodic structures of the first stress releasing layer 13 formed before growing the active layer 14 is less than or equal to the In component content in the active layer 14. Therefore, when the active layer 14 with high In component content is epitaxially grown on the first stress releasing layer 13, the influence of the built-in stress of the active layer 14 is weakened, and the defect density of the active layer 14 is reduced.

Figure 2:
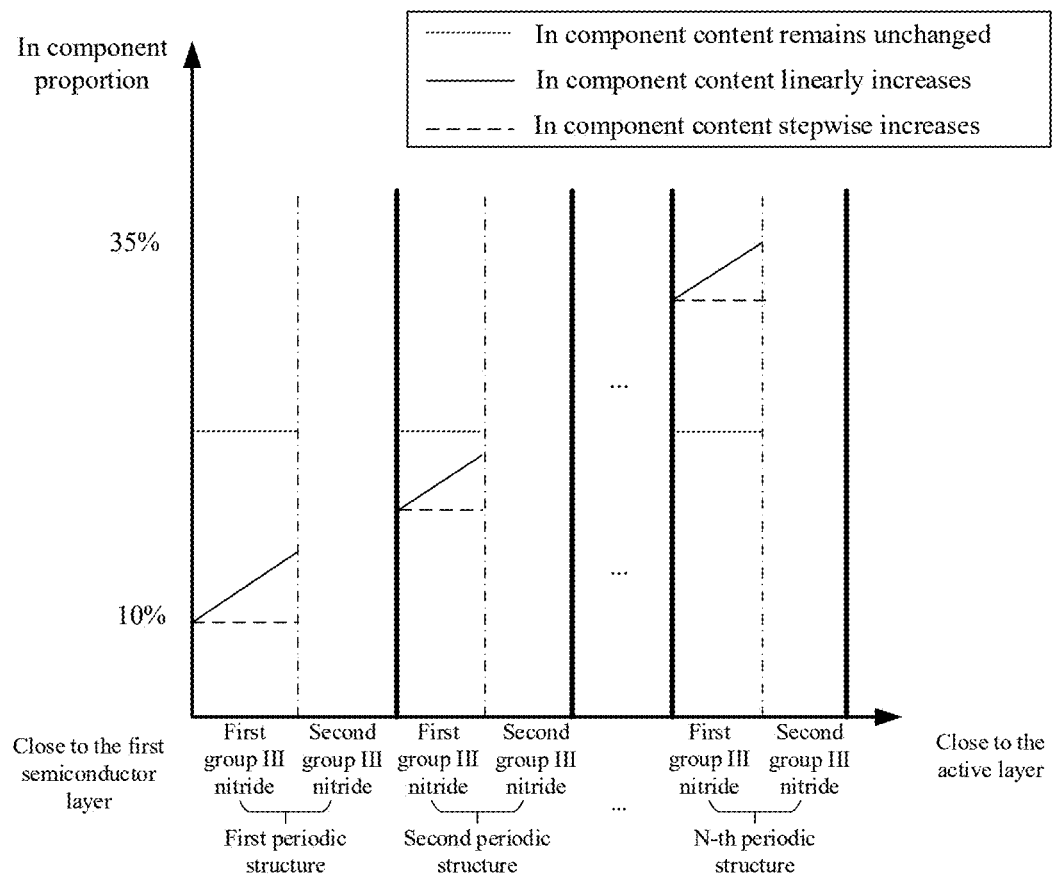
FIG. 2 is a graph showing a variation of an In component content of a stress releasing layer according to an embodiment of the present disclosure.

In some embodiments, referring to the solid line in FIG. 2, in the direction from the substrate 10 to the active layer 14, the In component content in the first group III nitride in each periodic structure of one or more periodic structures gradually increases. For example, in a periodic structure, the In component content in the first group III nitride varies linearly. In the periodic structure, the closer a part of the first group III nitride to the active layer, the higher the content of In component in the part of the first group III nitride, where the second group III nitride does not contain In component. In other embodiments, in the direction from the substrate 10 to the active layer 14, in each periodic structure of one or more periodic structures, the first group III nitride does not contain an In element, and the In component content in a second group III nitride gradually increases. In further embodiments, in the direction from the substrate 10 to the active layer 14, in each periodic structure of one or more periodic structures, the closer a part of the first group III nitride to the active layer, the higher the content of In component in the part of the first group III nitride, the closer a part of the second group III nitride to the active layer, the higher the content of In component in the part of the second group III nitride, and the first group III nitride and the second group III nitride are different. For example, the In component content in periodic structures increases linearly from 10% to 35%, which is not limited in the present disclosure. As a result, the average In component content in the periodic structures of the first stress releasing layer 13 formed before growing the active layer 14 is less than or equal to the In component content in the active layer 14. Therefore, when the active layer 14 with high In component content (e.g. with a In component proportion exceeding 40%) is epitaxially grown on the first stress releasing layer 13, the influence of the built-in stress of the active layer 14 is weakened, and the defect density of the active layer 14 is reduced.

Figure 3:
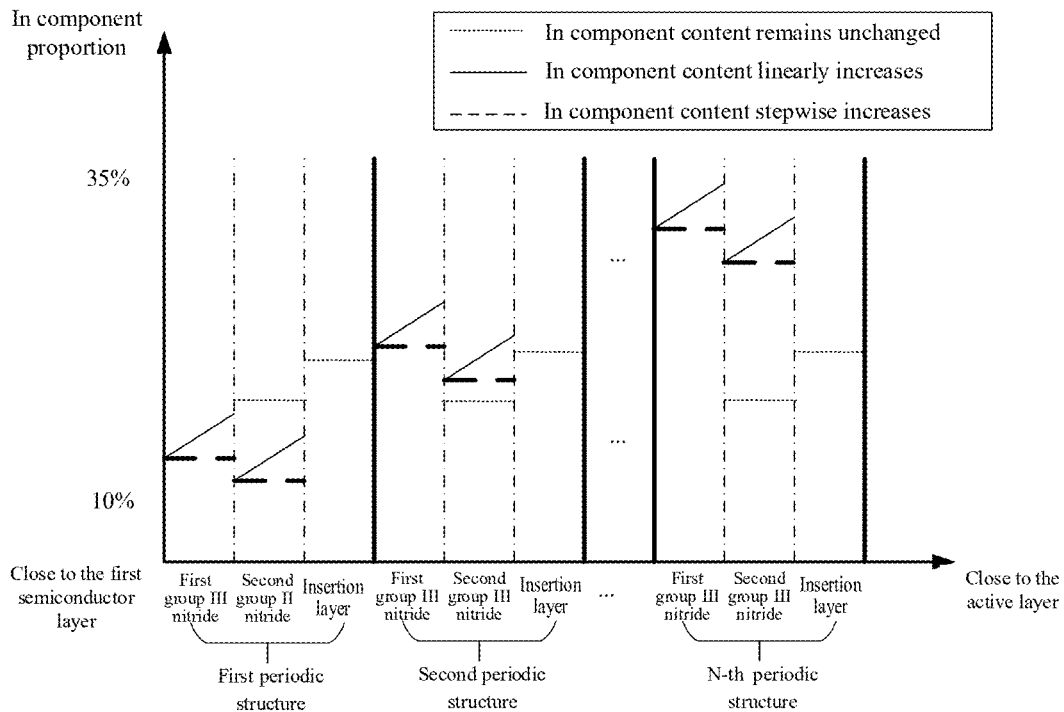
FIG. 3 is a graph showing a variation of an In component content of a stress releasing layer according to an embodiment of the present disclosure.
Figure 4:
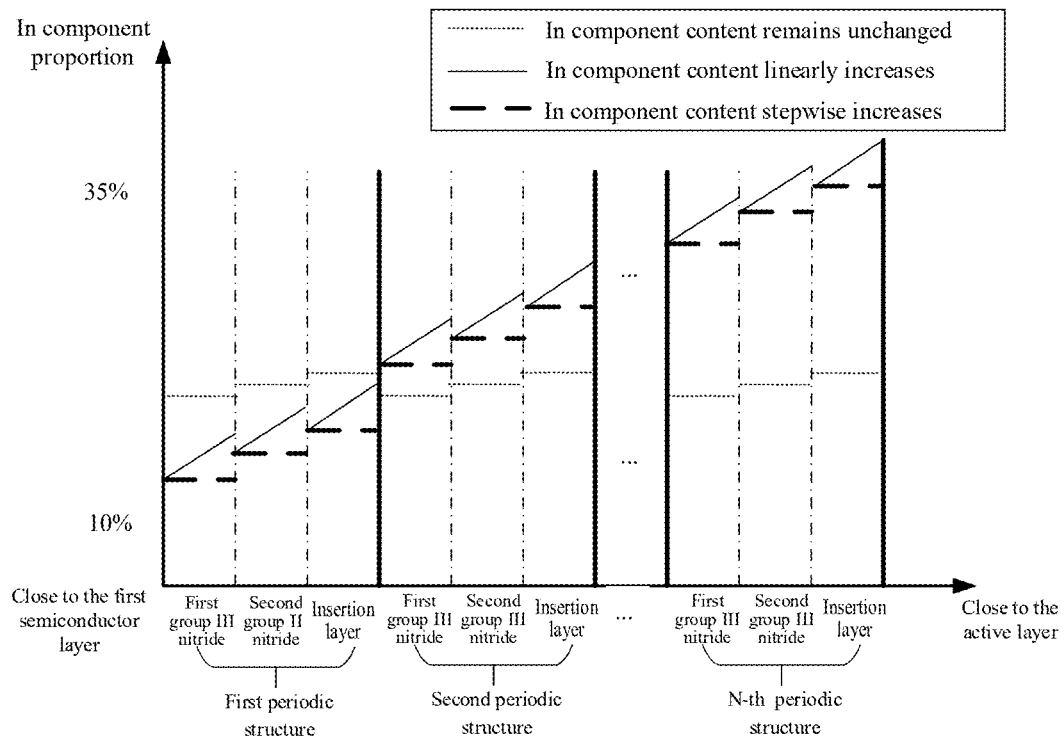
FIG. 4 is a graph showing a variation of an In component content of a stress releasing layer according to an embodiment of the present disclosure.

Each periodic structure may include not only a layer of the first group III nitride and a layer of the second group III nitride, but also at least one insertion layer, which may be located on a side of the first group III nitride close to the substrate 10, a side of the second group III nitride far from the substrate 10, and/or between the first group III nitride and the second group III nitride. An In component content in the insertion layer is different from an In component contents in the first and second group III nitrides. Each insertion layer includes group III nitride, and the formation process of the insertion layer can refer to the formation process of the first group III nitride and the second group III nitride of each layer, which is not repeated here. In an embodiment, when the periodic structure includes a layer of the first group III nitride, a layer of the second group III nitride, and an insertion layer, the In component content in the first group III nitrides and the second group III nitrides in the periodic structures can be linearly increasing, stepwise increasing, or constant, where the In component content in the first group III nitride is different from the In component content in the second group III nitride, and the insertion layer does not contain an In component. Alternatively, the In component content in the first group III nitrides, the second group III nitrides and insertion layers in the periodic structures can be linearly increasing, stepwise increasing, or constant, where the In component contents in the first group III nitride, the second group III nitride and the insertion layer are different. The changes of the corresponding In component content in the periodic structures can refer to the aforementioned embodiments, and as shown in FIG. 3 and FIG. 4, which is not repeated here.

The first group III nitride and/or the second group III nitride can include $Al_xIn_yN$, where x represents the content of the Al component, y represents the content of the In component, $x+y=1$, $0.65 \le x \le 0.9$, $0.1 \le y \le 0.35$, where the first group III nitride and the second group III nitride are different. In some embodiments, the group III nitride included in the insertion layer can include $Al_xIn_yN$, where $x+y=1$, $0.65 \le x \le 0.9$, $0.1 \le y \le 0.35$, and the group III nitride in the insertion layer is different from the first group III nitride and the second group III nitride.

The first group III nitride and/or the second group III nitride can include $Al_xIn_yGa_zN$, where x represents the content of the Al component, y represents the content of the In component, and z represents the content of the Ga component, $x+y+z=1$, $0.65*(1-z) \le x \le 0.9*(1-z)$, $0.1*(1-z) \le y \le 0.35*(1-z)$, and $0 \le z \le 0.5$, where the first group III nitride and the second group III nitride are different. In some embodiments, the group III nitride included in the insertion layer can include $Al_xIn_yGa_zN$, where $x+y+z=1$, $0.65*(1-z) \le x \le 0.9*(1-z)$, $0.1*(1-z) \le y \le 0.35*(1-z)$, $0 \le z \le 0.5$, and the group III nitride in the insertion layer is different from the first group III nitride and the second group III nitride.

When the first group III nitride is a group III nitride containing an In element, the second group III nitride includes at least one of: AlInGaN, GaN, AlGaN, InGaN, AlN or InN; or, when the second group III nitride is a group III nitride containing an In element, the first group III nitride includes at least one of: AlInGaN, GaN, AlGaN, InGaN, AlN or InN; which is not limited in the present disclosure. It should be noted that, in the embodiments of the present disclosure, in AlInGaN, GaN, AlGaN, InGaN, AlN and InN, a certain material is represented by chemical elements, but a molar ratio of each chemical element in the material is not limited. For example, GaN contains Ga element and N element, but the molar ratio of Ga element and N element is not limited.

In this embodiment, a proportion of the In component in the active layer 15 is greater than 30%, and a proportion of the In component in the active layer 15 is greater than 40%.

The thickness of one or more periodic structures in the first stress releasing layer 13 is between 10 nm and 500 nm.

In some embodiments, on the basis of the semiconductor structure 1, a buffer layer (not shown in FIG. 1) can further be provided between the substrate 10 and the first semiconductor layer 12. The buffer layer can reduce the dislocation density in the first semiconductor layer 12. A material of the buffer layer can include at least one of AlN, GaN, AlGaN or AlInGaN.

Figure 5:
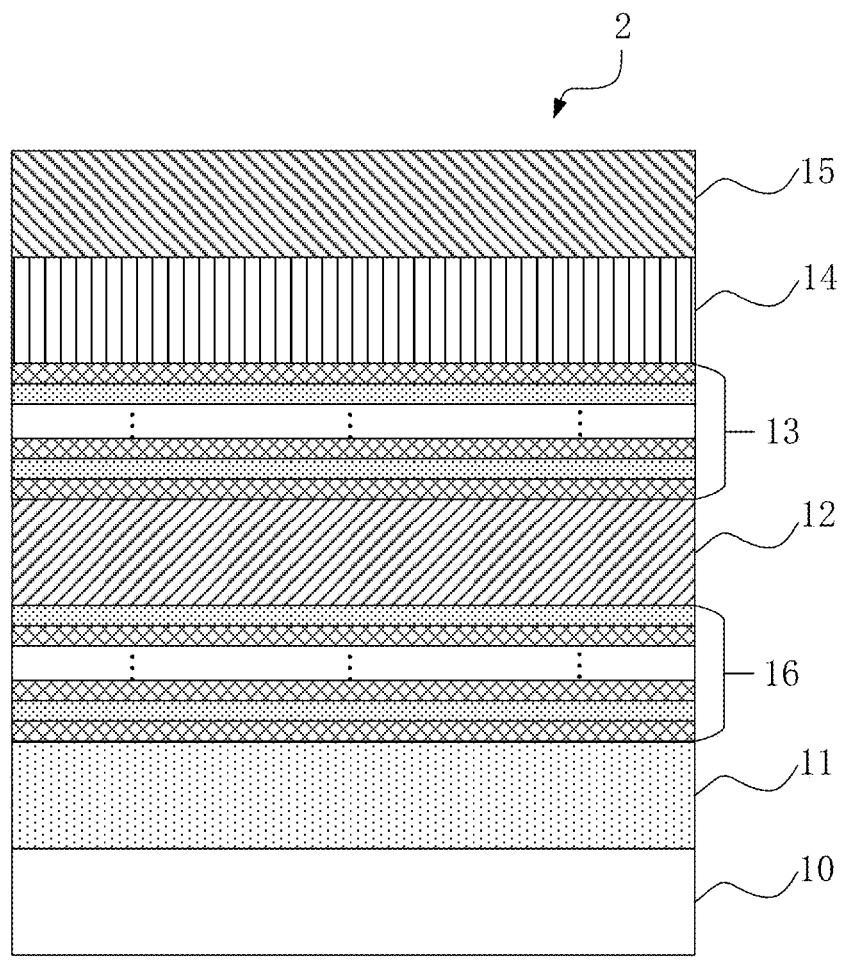
FIG. 5 is a schematic diagram of a semiconductor structure 2 according to an embodiment of the present disclosure.

FIG. 5 is a schematic diagram of a semiconductor structure 2 according to an embodiment of the present disclosure. The semiconductor structure 2 is similar to the semiconductor structure 1, with the difference that a buffer layer 11 and a second stress releasing layer 16 are further sequentially provided between the substrate 10 and the first semiconductor layer 12 from bottom to top. A structure or a material of the second stress releasing layer 16 can be the same as a structure or a material of the first stress releasing layer 13, and the second stress releasing layer 16 is used to reduce the built-in stress of the first semiconductor layer 12 and reduce the defect density of the first semiconductor layer 12. An average In component content in the second stress releasing layer 16 is less than or equal to an average In component content in the first stress releasing layer 13, so that in the direction from the substrate 10 to the second semiconductor layer 15, in the semiconductor structure 2, the In component content gradually increases while the built-in stress is gradually released. In some embodiments, the second stress releasing layer 16 can also be directly placed between the substrate 10 and the first semiconductor layer 12 without the buffer layer 11. For other structures in semiconductor structure 2, please refer to the description in semiconductor structure 1, which is not repeated in the present disclosure.

Figure 6:
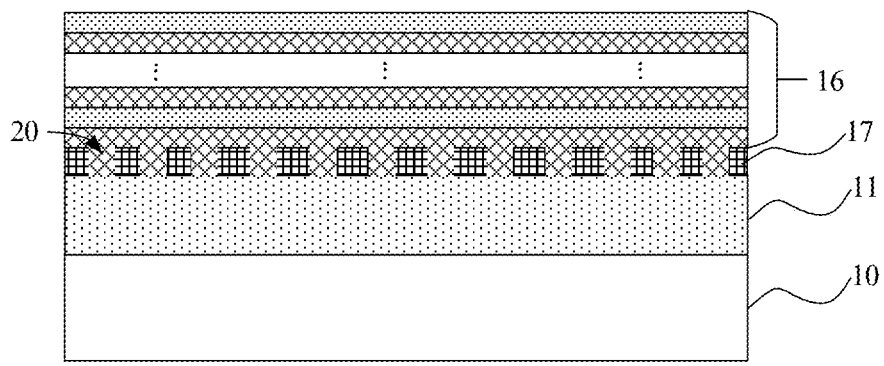
FIG. 6 is a schematic diagram of an intermediate structure of the semiconductor structure 2 according to an embodiment of the present disclosure.
Figure 7A:
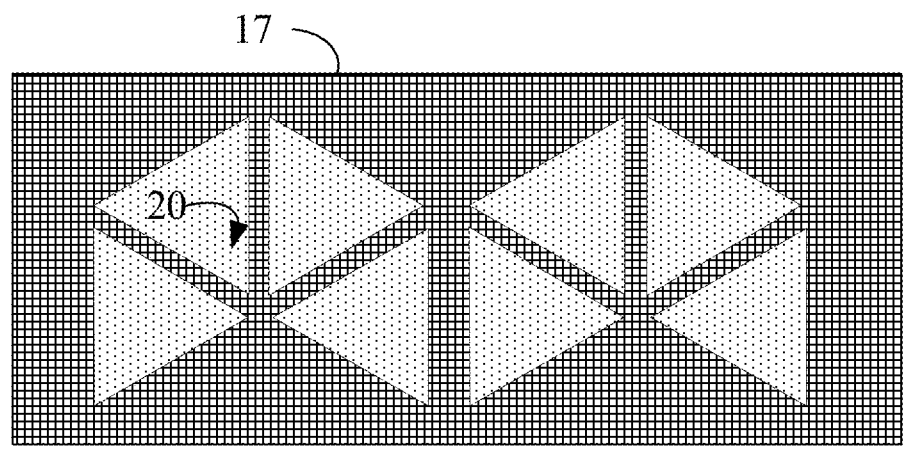
FIGS. 7a to 7e are top views of patterned mask layers according to embodiments of the present disclosure.
Figure 7B:
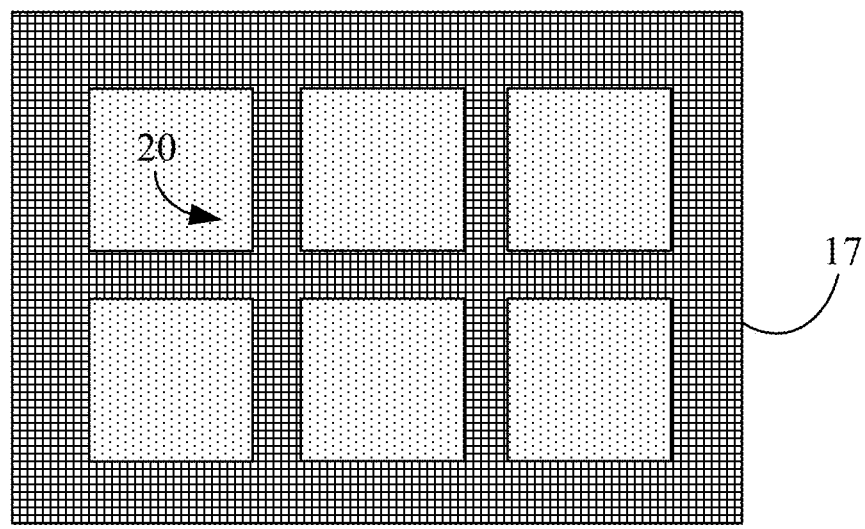
Figure 7C:
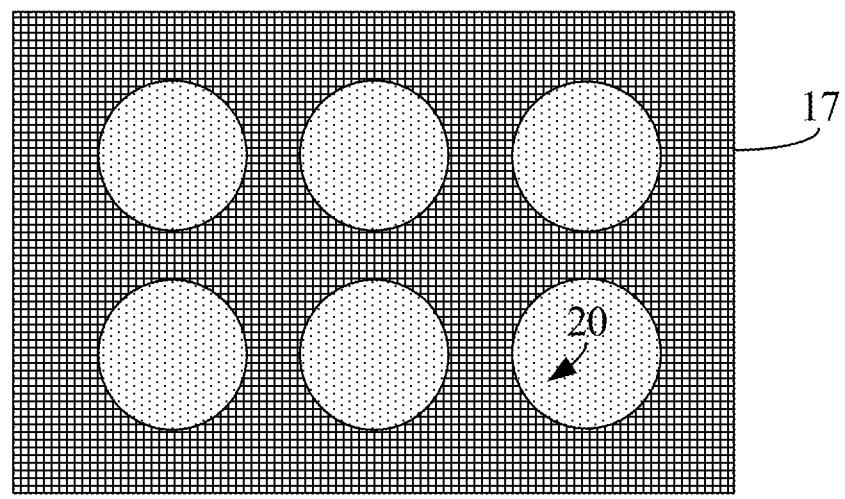
Figure 7D:
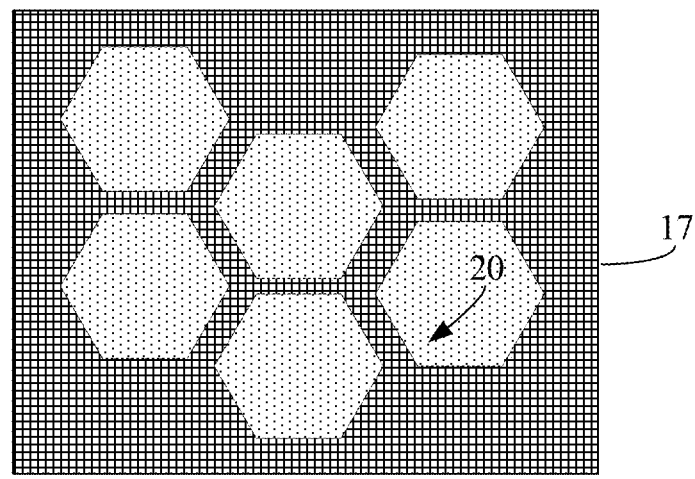
Figure 7E:
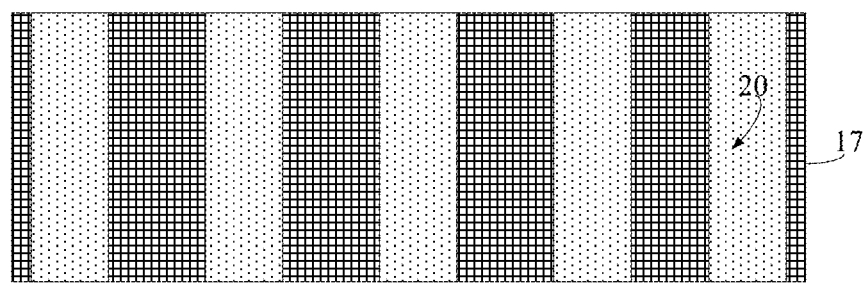

FIG. 6 is a schematic diagram of an intermediate structure of the semiconductor structure 2 according to an embodiment of the present disclosure. A mask layer 17 is provided on a side of the buffer layer 11 far from the substrate 10, and the mask layer 17 includes one or more grooves 20 that expose the buffer layer 11. The second stress releasing layer 16 grows laterally from the one or more grooves 20 to cover the surface of the mask layer 17. The second stress releasing layer 16 fills the one or more grooves 20 and covers the surface of the mask layer 17. By patterning mask layer 17, various shapes of grooves 20 can be formed, and when the second stress releasing layer 16 is epitaxially grown from the inside of the grooves 20, the stress in the second stress releasing layer 16 can be released laterally, thereby reducing the growth difficulty of the second stress releasing layer 16, and enabling the dislocations generated by the epitaxial growth of the buffer layer 11 on the substrate 10 to bend or stop, effectively reducing the defect density in the second stress releasing layer 16, further improving the crystal quality of the second stress releasing layer 16, thereby improving the crystal quality of other structural layers formed on the second stress releasing layer 16, and improving the performance of the semiconductor structure 2.

A material of the mask layer 17 may include $SiO_2$ or SiN, which is not limited in the present disclosure.

As shown in FIGS. 7a to 7e, the shapes of the grooves 20 in the mask layer 17 include triangular, square, elliptical, circular, hexagonal, elongated, and/or polygonal shapes, which is not limited in the present disclosure.

Figure 8:
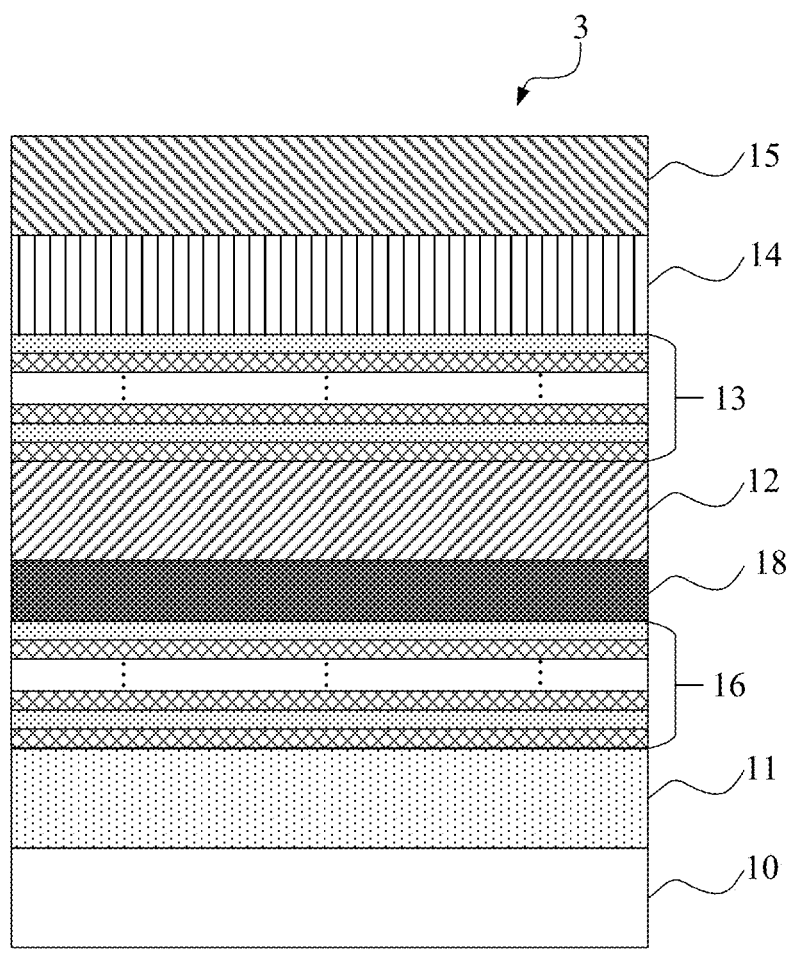
FIG. 8 is a schematic diagram of a semiconductor structure 3 according to an embodiment of the present disclosure.

FIG. 8 is a schematic diagram of a semiconductor structure 3 according to an embodiment of the present disclosure. The semiconductor structure 3 is similar to the semiconductor structure 2, with the difference that a protection layer 18 is further provided between the second stress releasing layer 16 and the first semiconductor layer 12. The protection layer 18 is configured to protect the second stress releasing layer 16, to avoid precipitation of In elements in the second stress releasing layer 16. A material of the protection layer 18 includes, but is not limited to, AlN or AlGaN. In other embodiments, a protection layer (not shown in the figures) can further be provided between the first stress releasing layer 13 and the active layer 14, the protection layer is used to protect the first stress releasing layer 13, to avoid the precipitation of In elements in the first stress releasing layer 13. A material of the protection layer includes, but is not limited to, AlN or AlGaN.

Figure 9:
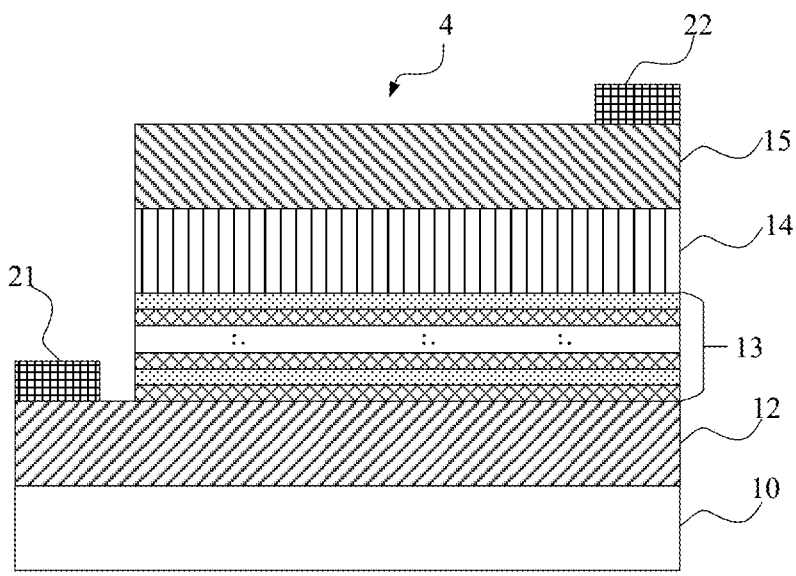
FIG. 9 is a schematic diagram of a semiconductor structure 4 according to an embodiment of the present disclosure.

FIG. 9 is a schematic diagram of a semiconductor structure 4 according to an embodiment of the present disclosure. The semiconductor structure 4 is similar to the semiconductor structure 1, with the difference that the semiconductor structure 4 further includes a first electrode 21 electrically connected to the first semiconductor layer 12 and a second electrode 22 electrically connected to the second semiconductor layer 15. When the first semiconductor layer 12 is an N-type semiconductor layer and the second semiconductor layer 15 is a P-type semiconductor layer, the first electrode 21 is an N-type electrode and the second electrode 22 is a P-type electrode. When the first semiconductor layer 12 is a P-type semiconductor layer and the second semiconductor layer 15 is an N-type semiconductor layer, the first electrode 21 is a P-type electrode and the second electrode 22 is an N-type electrode. A material of the first electrode 21 and a material of the second electrode 22 can include at least one of gold, silver, aluminium, chromium, nickel, platinum or titanium.

Figure 10:
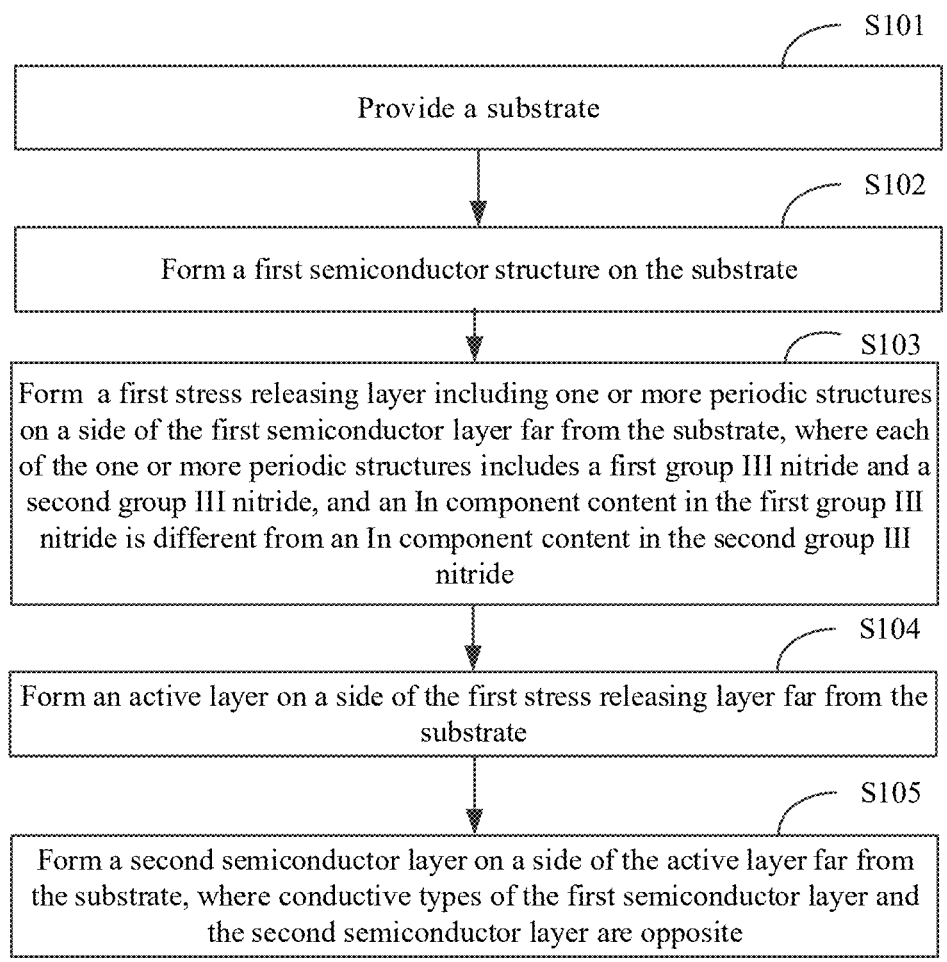
FIG. 10 is a flowchart of a manufacturing method of a semiconductor structure according to an embodiment of the present disclosure.

Corresponding to the aforementioned embodiment of semiconductor structure 1, the present disclosure further provides a manufacturing method for semiconductor structure 1. As shown in FIG. 10, the method includes steps S101 to S105.

In step S101, a substrate 10 is provided.

In step S102, a first semiconductor layer 12 is formed on the substrate 10.

In step S103, a first stress releasing layer 13 including one or more periodic structures is formed on a side of the first semiconductor layer 12 far from the substrate 10, each of the one or more periodic structures includes a first group III nitride and a second group III nitride, and an In component content in the first group III nitride is different from an In component content in the second group III nitride.

In step S104, an active layer 14 is formed on a side of the first stress releasing layer 13 far from the substrate 10, where an In component proportion in the active layer 14 is relatively high, for example, the In component proportion exceeds 40%.

In step S105, a second semiconductor layer 15 is formed on a side of the active layer 14 far from the substrate 10, where the conductive types of the first semiconductor layer 12 and the second semiconductor layer 15 are opposite.

The formation processes of the first semiconductor layer 12, the first stress releasing layer 13, the active layer 14 and the second semiconductor layer 15 can include: atomic layer deposition (ALD), chemical vapor deposition (CVD), molecular beam epitaxy (MBE), plasma enhanced chemical vapor deposition (PECVD), low pressure chemical vapor deposition (LPCVD), metal organic compound chemical vapor deposition, or a combination thereof, which is not limited in the present disclosure. The function of each layer is explained in the description of the semiconductor structure accordingly and is not repeated here.

Figure 11:
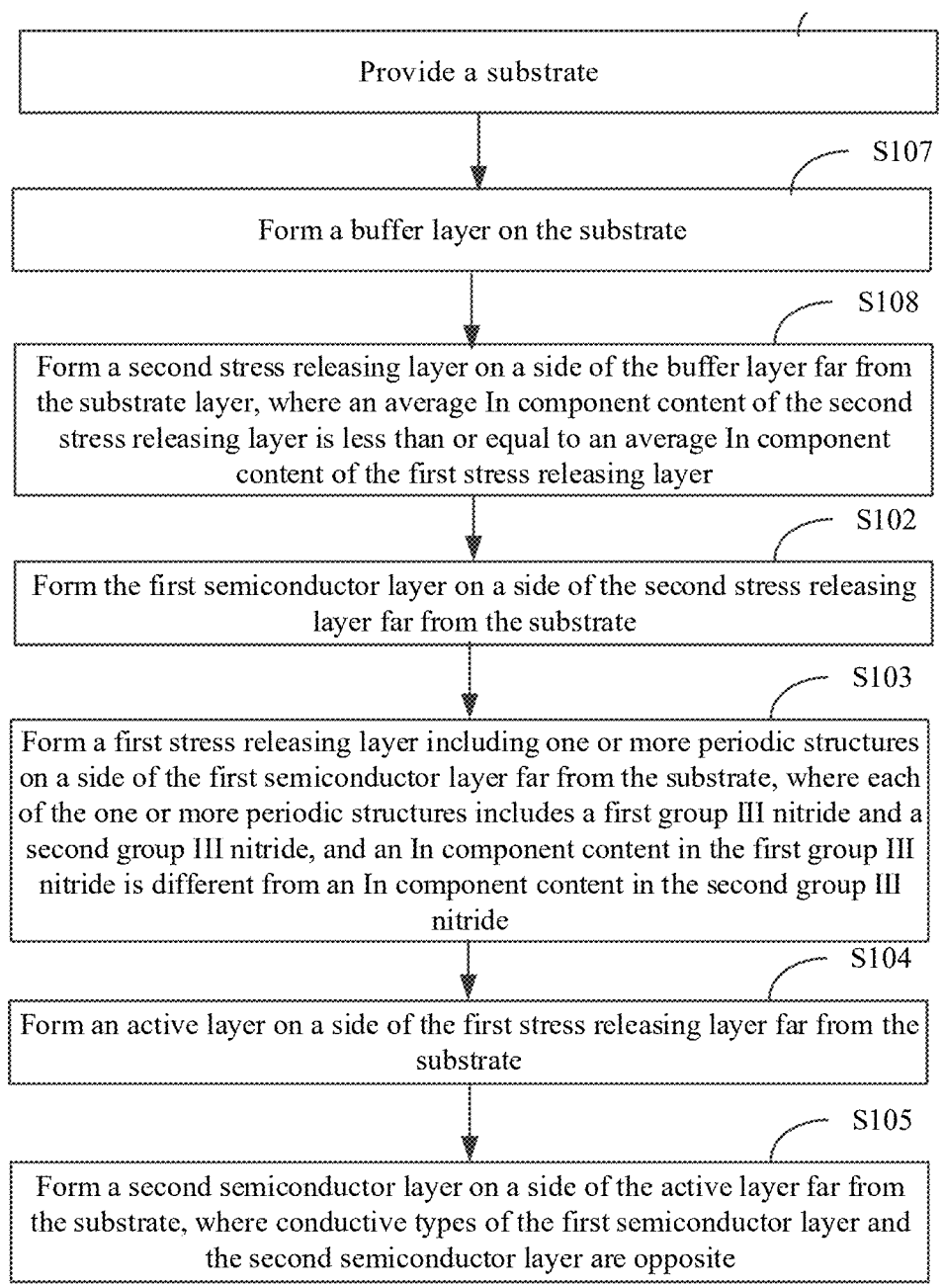
FIG. 11 is a flowchart of a manufacturing method of a semiconductor structure according to an embodiment of the present disclosure.

Corresponding to the aforementioned embodiment of semiconductor structure 2, the present disclosure further provides a manufacturing method for semiconductor structure 2 as shown in FIG. 11. The difference from the manufacturing method for semiconductor structure 1 includes that before forming the first semiconductor layer 12, the method further includes steps S107 to S108. In step S107, a buffer layer 11 is formed on the substrate 10. In step S108, a second stress releasing layer 16 is formed on a side of the buffer layer 11 far from the substrate layer 10. In step S102, a first semiconductor layer 12 is formed on a side of the second stress releasing layer 16 far from the substrate layer 10, where an average In component content in the second stress releasing layer 16 is less than or equal to an average In component content in the first stress releasing layer 13, where a structure or a material of the second stress releasing layer 16 can be the same as a structure or a material of the first stress releasing layer 13. The specific description can refer to the above embodiment. In other embodiments, the step S107 of forming the buffer layer 11 can be omitted. The function of each layer is explained in the description of the semiconductor structure accordingly and is not repeated here.

Figure 12:
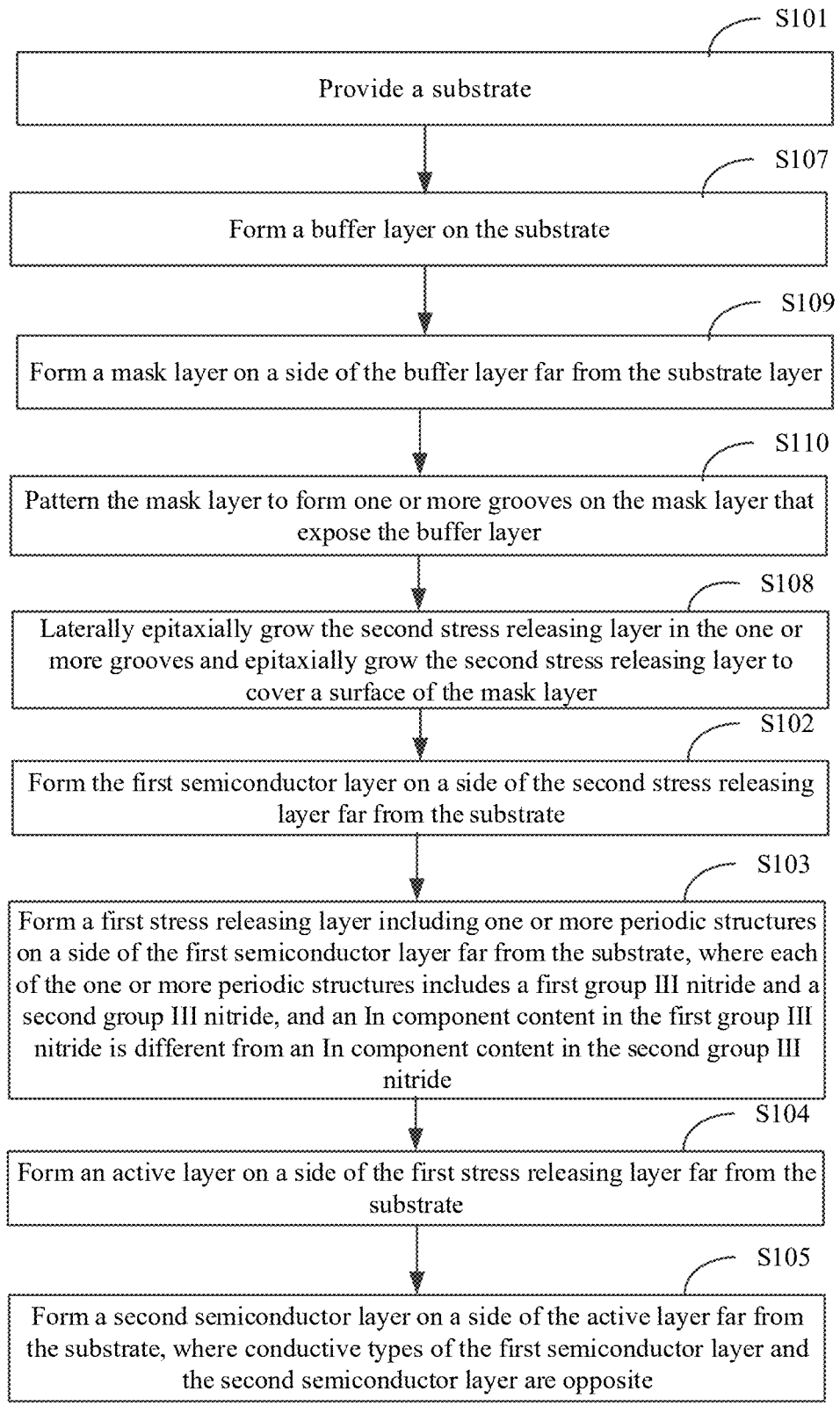
FIG. 12 is a flowchart of a manufacturing method of a semiconductor structure according to an embodiment of the present disclosure.

Corresponding to the aforementioned embodiment of semiconductor structure 2, the present disclosure further provides another manufacturing method for semiconductor structure 2 as shown in FIG. 12. On the basis of manufacturing semiconductor structure 2, before forming the second stress releasing layer 16, the method further includes steps S109 to S110. In step S109, a mask layer 17 is formed on a side of the buffer layer 11 far from the substrate layer 10. In step S110, the mask layer 17 is patterned to form one or more grooves 20 on the mask layer 17 that expose the buffer layer 11. In step S108, a second stress releasing layer 16 is laterally epitaxially grown in the one or more grooves 20 and grown to cover a surface of the mask layer 17. A structure or a material of the second stress releasing layer 16 can be the same as the structure or the material of the first stress releasing layer 13. Details can refer to each other. The function of each layer is explained in the description of the semiconductor structure accordingly and is not repeated here.

Figure 13:
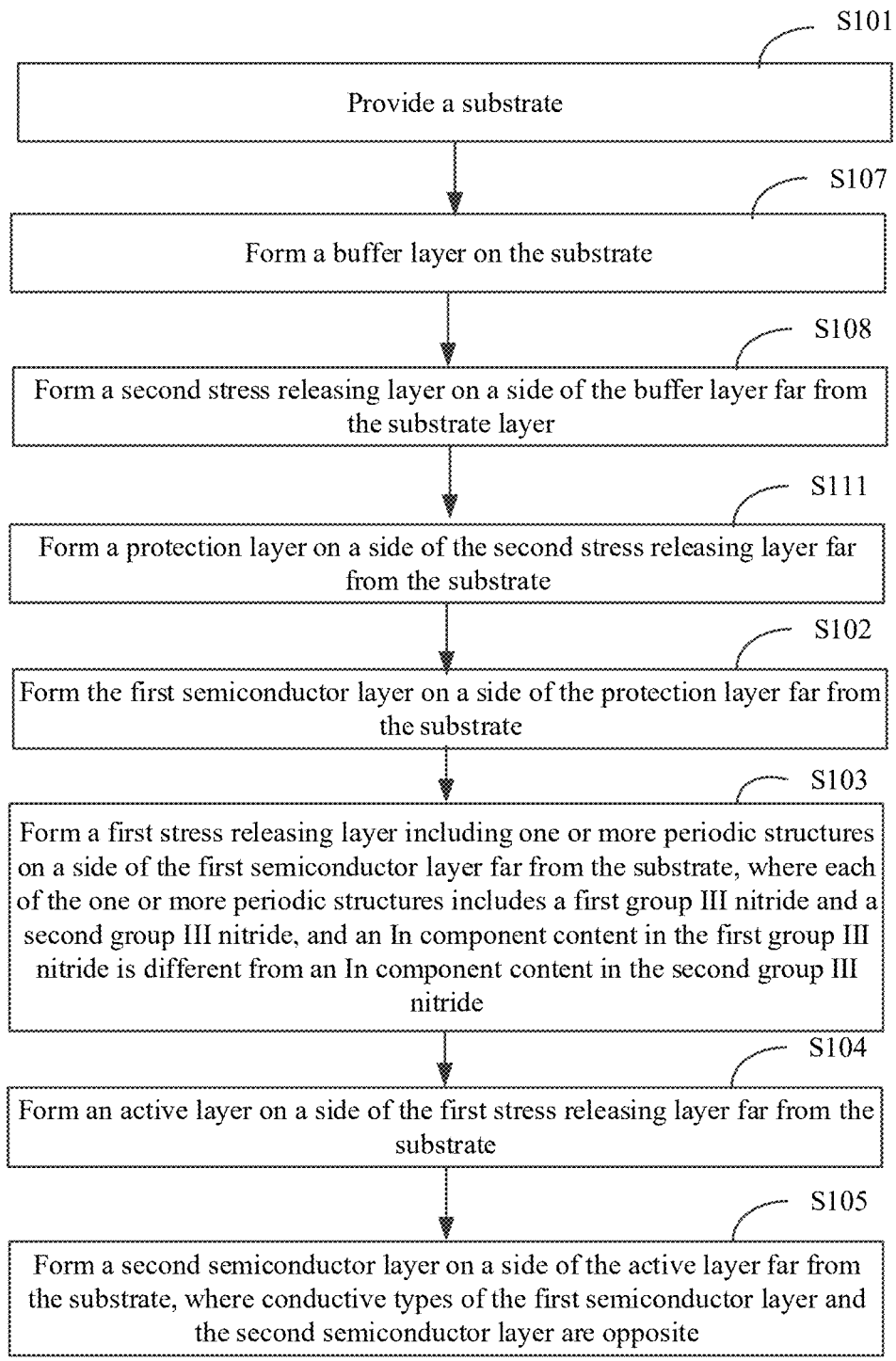
FIG. 13 is a flowchart of a manufacturing method of a semiconductor structure according to an embodiment of the present disclosure.

Corresponding to the aforementioned embodiment of semiconductor structure 3, the present disclosure further provides a manufacturing method for semiconductor structure 3 as shown in FIG. 13. The difference from the manufacturing method for semiconductor structure 2 includes that after forming the second stress releasing layer 16 and before forming the first semiconductor layer 12, the method further includes step S111. In step S111, a protection layer 18 is formed on a side of the second stress releasing layer 16 far from the substrate 10. In step S102, the first semiconductor layer 12 is formed on a side of the protection layer 18 far from the substrate 10. The function of each layer is explained in the description of the semiconductor structure accordingly and is not repeated here. In other embodiments, before forming the active layer 14, i.e., before step S104, the method further includes forming a protection layer on aside of the first stress releasing layer 13 far from the substrate 10.

Corresponding to the aforementioned embodiment of semiconductor structure 4, the present disclosure further provides a manufacturing method for semiconductor structure 4. The difference from the manufacturing method for semiconductor structure 1 includes that the second semiconductor layer 15, the active layer 14 and the first stress releasing layer 13 are etched to expose a portion of the first semiconductor layer 12, a first electrode 21 is formed on the exposed portion of the first semiconductor layer 12, and a second electrode 22 is formed on the second semiconductor layer 15.

In the semiconductor structures and the manufacturing methods of the semiconductor structures according to the present disclosure, a stress releasing layer is provided between the active layer and the substrate, where the stress releasing layer includes one or more periodic structures containing In element, so that the built-in stress in In-containing material of the active layer is released, thereby allowing the epitaxial growth of high-quality active layer with high In component content, thereby obtaining a high-quality semiconductor structure.

For the semiconductor structure and the manufacturing method of the semiconductor structure of the present disclosure, a first stress releasing layer including one or more periodic structures containing an In element is provided between the first semiconductor layer and the active layer, so that the built-in stress in the active layer formed on the first semiconductor layer is reduced, and thus an active layer with a high In component content can be epitaxially grown while ensuring high crystal quality.

Each periodic structure in the first stress releasing layer 13 includes a first group III nitride and a second group III nitride, where an In component content in the first group III nitride is different from an In component content in the second group III nitride. The periodic structure alternately composed of the first group III nitride and the second group III nitride with different In component contents can effectively avoid the precipitation of In element in the first stress releasing layer and improve the stability of the In component in the first stress releasing layer, ensuring that the stress of the active layer with high In composition can be released, thereby avoiding the precipitation of In element in the active layer and increasing the In composition content in the active layer.

The average In component content in the first stress releasing layer is less than or equal to the In component content in the active layer, to enable the first stress releasing layer to effectively transition to the active layer to ensure the crystal quality of the active layer with high In component content.

Although the present disclosure is disclosed as above, the present disclosure is not limited thereto. Any person skilled in the art can make various changes and modifications without departing from the spirit and scope of the present disclosure, and therefore the scope of protection of the present disclosure shall be subject to the scope defined by the claims.

What is claimed is:

1. A semiconductor structure, comprising:
a substrate; and
a first semiconductor layer, a first stress releasing layer, an active layer and a second semiconductor layer that are sequentially stacked on the substrate from bottom to top;
wherein conductive types of the first semiconductor layer and the second semiconductor layer are opposite, the first stress releasing layer comprises one or more periodic structures, each of the one or more periodic structures comprises a first group III nitride and a second group III nitride, and an In component content in the first group III nitride is different from an In component content in the second group III nitride;
wherein the first stress releasing layer comprises multiple periodic structures along a direction from the substrate to the active layer,
wherein an average In component content in first group III nitrides in the multiple periodic structures and/or an average In component content in second group III nitrides in the multiple periodic structures remains unchanged; or
the average In component content in first group III nitrides in the multiple periodic structures and/or the average In component content in second group III nitrides in the multiple periodic structures gradually increases.

2. The semiconductor structure according to claim 1, wherein an average In component content in the first stress releasing layer is less than or equal to an In component content in the active layer.

3. The semiconductor structure according to claim 1, wherein along the direction from the substrate to the active layer, in each periodic structure of the multiple periodic structures, the In component content in the first group I nitride and/or the In component content in the second group III nitride gradually increases.

4. The semiconductor structure according to claim 1, wherein the first group III nitride comprises $Al_xIn_yN$, wherein x represents an Al component content, y represents an In component content, $x+y=1$, $0.65 \leq x \leq 0.9$, and $0.1 \leq y \leq 0.35$.

5. The semiconductor structure according to claim 1, wherein the first group III nitride comprises $Al_xIn_yGa_zN$, wherein x represents an Al component content, y represents an In component content, z represents a Ga component content, $x+y+z=1$, $0.65*(1-z) \leq x \leq 0.9*(1-z)$, $0.1*(1-z) \leq y \leq 0.35*(1-z)$, and $0 \leq z \leq 0.5$.

6. The semiconductor structure according to claim 1, wherein a thickness of the one or more periodic structures is between 10 nm and 500 nm.

7. The semiconductor structure according to claim 1, wherein the first group III nitride or the second group III nitride comprises at least one of AlInN, InAlGaN, GaN, AlGaN, InGaN, AlN or InN.

8. The semiconductor structure according to claim 1, further comprising:
a second stress releasing layer between the substrate and the first semiconductor layer, wherein an average In component content in the second stress releasing layer is less than or equal to the average In component content in the first stress releasing layer.

9. The semiconductor structure according to claim 8, further comprising:
a buffer layer between the substrate and the second stress releasing layer.

10. The semiconductor structure according to claim 9, further comprising:
a mask layer on a side of the buffer layer far from the substrate, wherein the mask layer comprises one or more grooves that expose the buffer layer, and the second stress releasing layer fills the one or more grooves and covers a surface of the mask layer.

11. The semiconductor structure according to claim 10, wherein a shape of the one or more grooves comprises at least one of polygonal, elongated, elliptical or circular.

12. The semiconductor structure according to claim 8, further comprising:
a protection layer between the second stress releasing layer and the first semiconductor layer, and/or
a protection layer between the first stress releasing layer and the active layer, wherein a material of the protection layer comprises AlN or AlGaN.

13. The semiconductor structure according to claim 1, further comprising:
- a first electrode electrically connected to the first semiconductor layer; and
- a second electrode electrically connected to the second semiconductor layer.

14. A manufacturing method of a semiconductor structure, comprising:
- providing a substrate;
- forming a first semiconductor layer on the substrate;
- forming a first stress releasing layer comprising one or more periodic structures on a side of the first semiconductor layer far from the substrate, wherein each of the one or more periodic structures comprises a first group III nitride and a second group III nitride, and an In component content in the first group III nitride is different from an In component content in the second group III nitride;
- forming an active layer on a side of the first stress releasing layer far from the substrate; and
- forming a second semiconductor layer on a side of the active layer far from the substrate, wherein conductive types of the first semiconductor layer and the second semiconductor layer are opposite;
- wherein before forming the first semiconductor layer, the method further comprises:
  - forming a buffer layer on the substrate;
  - forming a second stress releasing layer on a side of the buffer layer far from the substrate, wherein an average In component content of the second stress releasing layer is less than or equal to an average In component content of the first stress releasing layer; and
  - forming the first semiconductor layer on a side of the second stress releasing layer far from the substrate.

15. The method according to claim 14, wherein before forming the second stress releasing layer, the method further comprises:
- forming a mask layer on a side of the buffer layer far from the substrate layer;
- patterning the mask layer to form one or more grooves on the mask layer that expose the buffer layer; and
- laterally epitaxially growing the second stress releasing layer in the one or more grooves and epitaxially growing the second stress releasing layer to cover a surface of the mask layer.

16. The method according to claim 14, wherein before forming the first semiconductor layer, the method further comprises:
- forming a protection layer on a side of the second stress releasing layer far from the substrate; and/or
- before forming the active layer, the method further comprises:
- forming a protection layer on a side of the first stress releasing layer far from the substrate.

17. The method according to claim 14, further comprising:
- etching the second semiconductor layer, the active layer and the first stress releasing layer, to expose a portion of the first semiconductor layer;
- forming a first electrode on the exposed portion of the first semiconductor layer; and
- forming a second electrode on the second semiconductor layer.

18. A semiconductor structure, comprising:
- a substrate;
- a first semiconductor layer, a first stress releasing layer, an active layer and a second semiconductor layer that are sequentially stacked on the substrate from bottom to top;
- wherein conductive types of the first semiconductor layer and the second semiconductor layer are opposite, the first stress releasing layer comprises one or more periodic structures, each of the one or more periodic structures comprises a first group III nitride and a second group III nitride, and an In component content in the first group III nitride is different from an In component content in the second group III nitride; and
- a second stress releasing layer between the substrate and the first semiconductor layer, wherein an average In component content in the second stress releasing layer is less than or equal to the average In component content in the first stress releasing layer.

* * * * *